(12) United States Patent
Shirakawa et al.

(10) Patent No.: US 6,969,913 B2
(45) Date of Patent: Nov. 29, 2005

(54) SEMICONDUCTOR DEVICE AND MANUFACTURING METHOD FOR THE SAME

(75) Inventors: Tatsuhiko Shirakawa, Yokohama (JP); Yoshiaki Sugizaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 10/796,029

(22) Filed: Mar. 10, 2004

(65) Prior Publication Data

US 2005/0151267 A1    Jul. 14, 2005

(30) Foreign Application Priority Data

Jan. 9, 2004    (JP) .............................. 2004-003567

(51) Int. Cl.[7] ............................................. H01L 23/48
(52) U.S. Cl. ...................... 257/777; 257/778; 438/106; 438/108
(58) Field of Search ............................... 257/777, 778; 438/108

(56) References Cited

U.S. PATENT DOCUMENTS 5,528,458 A * 6/1996 Yasuho et al. ............... 361/718
5,661,086 A * 8/1997 Nakashima et al. ......... 257/668
6,011,694 A * 1/2000 Hirakawa .................... 361/774
6,870,249 B2 * 3/2005 Egawa ........................ 257/686

FOREIGN PATENT DOCUMENTS

JP  07-115112   5/1995
JP  08-070024   3/1996
JP  09-129673   5/1997

* cited by examiner

Primary Examiner—Thao P. Le
(74) Attorney, Agent, or Firm—Finnegan, Henderson, Farabow, Garrett & Dunner, L.L.P.

(57) ABSTRACT

There is here disclosed a semiconductor device comprising a first base material which is provided at least one semiconductor device mounted on one main surface, a plurality of first connection portions provided on the main surface and being electrically connected to the semiconductor device, and a plurality of second connection portions provided outside a region on which the semiconductor device is mounted on the main surface, and a second base material which is disposed facing other main surface of the first base material on a side opposite to the side on which the semiconductor device is mounted, bonded to an edge of the first base material, and provided a plurality of third connection portions provided outside a region on which the first base material is mounted on and being electrically connected to at least one of the second connection portions.

10 Claims, 4 Drawing Sheets

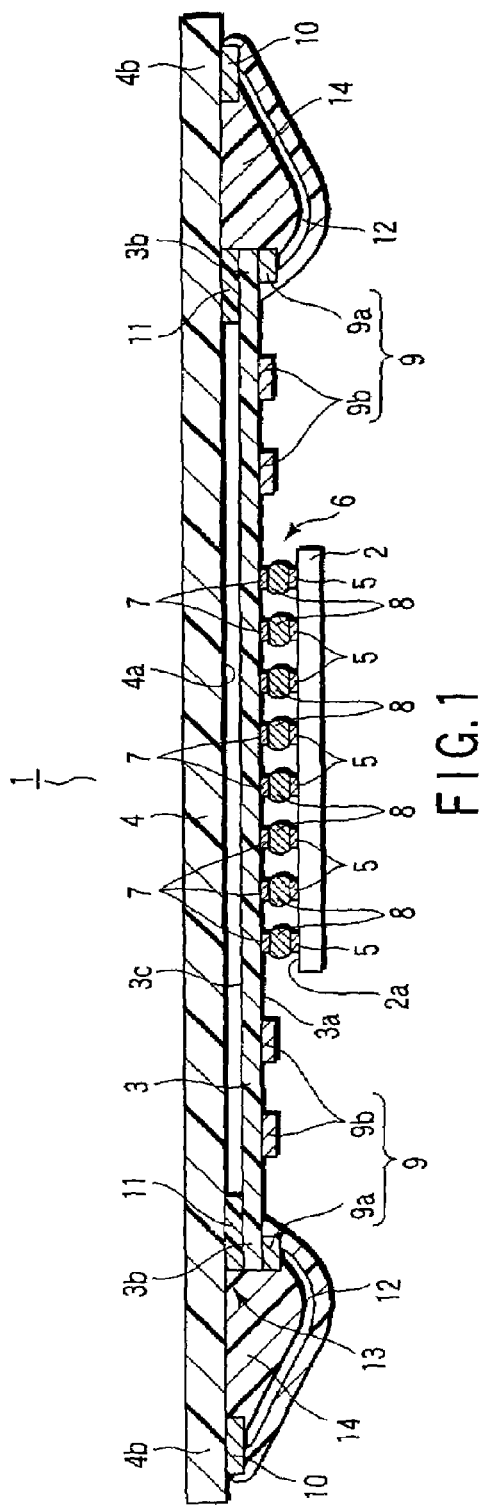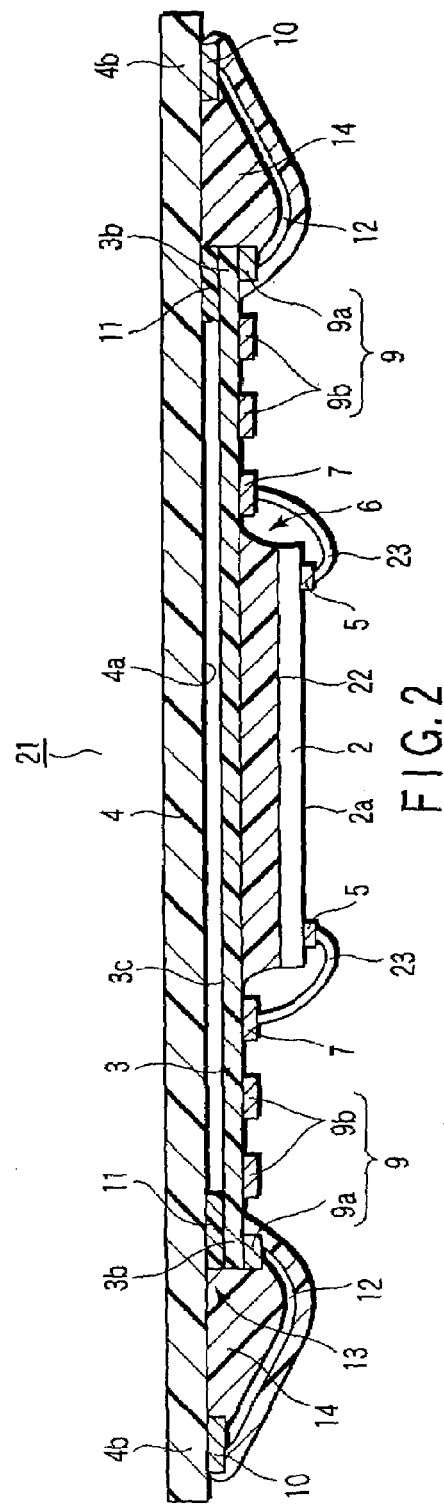

SEMICONDUCTOR DEVICE AND MANUFACTURING METHOD FOR THE SAME

CROSS-REFERENCE TO RELATED APPLICATIONS

This application is based upon and claims the benefit of priority from prior Japanese Patent Applications No. 2004-003567, filed Jan. 9, 2004, the entire contents of which are incorporated herein by reference.

BACKGROUND OF THE INVENTION

1. Field of the Invention

The present invention relates to a mounting technique of a semiconductor device, particularly to a wiring structure of a base material on which a semiconductor device is directly or indirectly mounted, and a connection structure between a semiconductor device and a base material or between the base materials.

2. Description of the Related Art

Several techniques concerning a wiring structure of a base material (substrate) on which a semiconductor device (semiconductor chip) is directly or indirectly mounted have heretofore been proposed. These techniques have been described, for example, in Jpn. Pat. Appln. KOKAI Publication Nos. 7-115112, 8-70024, 9-129673 and the like.

In a general semiconductor device, a semiconductor chip is directly mounted on one main surface (chip mounting surface) of a double-surface wiring substrate on whose opposite main surfaces wirings are formed. A plurality of chip connection wirings electrically connected to the semiconductor chip are formed on the chip mounting surface of the substrate. Chip connection pads for a plurality of electrode pads formed on the semiconductor chip are formed on the respective chip connection wirings. Each electrode pad is bonded to each chip connection pad, and the semiconductor chip is electrically connected to each chip connection wiring. An external wiring (external terminal) for electrically connecting the semiconductor chip to another substrate, electric component or the like is formed on the other main surface (chip non-mounting surface) of the substrate.

Since a connection density of the semiconductor chip to a wiring substrate is high in the wiring substrate having the above-described wiring structure, a need for miniaturization and multilayer of the wiring substrate easily arises. The wirings or the terminals need to be formed on the opposite main surfaces of the wiring substrate. Therefore, a manufacturing cost of the wiring substrate easily increases. Additionally, the manufacturing cost of the semiconductor device provided with this wiring substrate easily increases. In the method of connecting the semiconductor chip to the wiring substrate, a large stress is easily applied onto a connection portion between the semiconductor chip and the wiring substrate, the surface of the semiconductor chip or the like because of a difference in coefficient of thermal expansion between the chip and substrate. Especially, when a brittle low-k film is used in an interlayer insulating film in the semiconductor chip, there is a high possibility that fatal defects such as peeling of the interlayer insulating film are caused by the stress applied onto the semiconductor chip. That is, there is a high possibility that durability, reliability, capability, quality and the like of the semiconductor device are deteriorated.

BRIEF SUMMARY OF THE INVENTION

According to an aspect of the invention, there is provided a semiconductor device comprising: a first base material which is provided at least one semiconductor device mounted on one main surface of the first base material, a plurality of first connection portions provided on the main surface of the first base material on the side on which the semiconductor device is mounted and being electrically connected to the semiconductor device, and a plurality of second connection portions provided outside a region on which the semiconductor device is mounted on the main surface of the first base material on the side on which the semiconductor device is mounted; and a second base material which is disposed facing the main surface of the first base material on a side opposite to the side on which the semiconductor device is mounted, bonded to an edge of the first base material so that the first base material is mounted on the second base material, and provided a plurality of third connection portions provided outside a region on which the first base material is mounted on the main surface of the second base material on the side facing the first base material and being electrically connected to at least one of the second connection portions.

According to another aspect of the invention, there is provided a manufacturing method for a semiconductor device, comprising: disposing a first base material and a second base material in such a manner that the first and second base materials face each other, the first base material is provided at least one semiconductor device mounted on one main surface of the first base material, the first base material is provided a plurality of first connection portions provided on the main surface of the first base material on a side on which the semiconductor device is mounted and being electrically connected to the semiconductor device, and the first base material is provided a plurality of second connection portions provided outside a region on which the semiconductor device is mounted on the main surface of the first base material on the side on which the semiconductor device is mounted, and the second base material being disposed facing the main surface of the first base material on a side opposite to the side on which the semiconductor device is mounted, and the second base material including a plurality of third connection portions provided outside a region on which the first base material is mounted on the main surface of the second base material on the side facing the first base material and being electrically connected to at least one of the second connection portions, and mounting the first base material on the second base material, by bonding an edge of the first base material to the second base material.

BRIEF DESCRIPTION OF THE SEVERAL VIEWS OF THE DRAWING

FIG. 1 is a sectional view showing a semiconductor device according to a first embodiment;

FIG. 2 is a sectional view showing the semiconductor device according to a second embodiment;

DETAILED DESCRIPTION OF THE INVENTION

Figure 3:
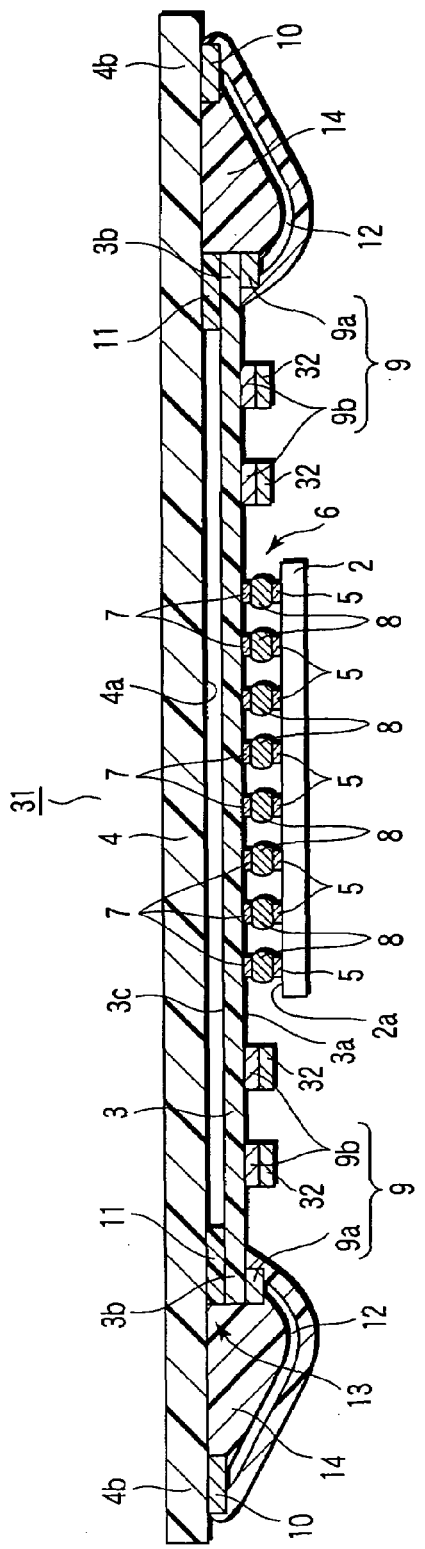
FIG. 3 is a sectional view showing the semiconductor device according to a third embodiment.

Embodiments of the present invention will be described hereinafter with reference to the drawings.

First Embodiment

First, a first embodiment of the present invention will be described with reference to FIG. 1. FIG. 1 is a sectional view showing a semiconductor device according to the present embodiment.

The present embodiment relates to a structure of the semiconductor device, particularly to a wiring structure of each base material on which a thin semiconductor device is directly or indirectly mounted and a bonding technique between the base materials. This will be described hereinafter in detail.

As shown in FIG. 1, in a semiconductor device 1 of the present embodiment, two base materials including a first base material 3 and a second base material 4 are used with respect to at least one semiconductor device (semiconductor chip) 2. The semiconductor chip 2 is formed in a thin shape whose thickness is about 0.15 mm or less. A plurality of terminals (electrode pads) 5 for electrically connecting and mounting the semiconductor chip 2 onto the first base material 3 are provided on a device forming surface 2a of the semiconductor chip 2.

The semiconductor chip 2 is mounted on a chip mounting surface 3a which is one main surface of the first chip mounting substrate 3 as the first base material (first wiring substrate). In the present embodiment, a middle part of the chip mounting surface 3a is set to a chip mounting region 6 on which the semiconductor chip 2 is mounted. A plurality of first connection portions (chip connection pads) 7 electrically connected to the respective electrode pads 5 of the semiconductor chip 2 are provided for the electrode pads 5. The respective electrode pads 5 of the semiconductor chip 2 are connected to the respective chip connection pads 7 of the first chip mounting substrate 3 via bonding members (solder bumps) 8 having conductivity. That is, the semiconductor chip 2 is flip-chip-connected to the first chip mounting substrate 3 in the present embodiment. The semiconductor chip 2 is mounted on the first chip mounting substrate 3 in a state in which the device forming surface 2a is directed to the chip mounting surface 3a of the first chip mounting substrate 3, so-called face-down state.

A plurality of second connection portions 9 for electrically connecting the semiconductor chip 2 to the outside are provided outside the chip mounting region 6 of the chip mounting surface 3a. Some of the respective second connection portions 9 are electrically connected to third connection portions 10 provided on the second base material 4 described later. For each second connection portion 9, a second connection portion 9a to be connected to the third connection portion 10 is provided on an edge 3b of the first chip mounting substrate 3. In the following description, the second connection portion connected to the third connection portion 10 will be referred to as the first substrate connection pad 9a. Among the respective second connection portions 9, second connection portions 9b except the first substrate connection pads 9a are electrically connected to external electric components such as a mounting substrate and passive component (not shown). In the following description, the second connection portions connected to these external electric components will be referred to as the external connection pads (external terminals) 9b. These external connection pads 9b are disposed between a middle part which is the chip mounting region 6 and the edge 3b on which the first substrate connection pad 9a is disposed on the chip mounting surface 3a.

It is to be noted that the respective chip connection pads 7, first substrate connection pads 9a, and external connection pads 9b constitute some of a plurality of wirings (not shown) formed in predetermined patterns on the side of the chip mounting surface 3a of the first chip mounting substrate 3. The other main surface of the first chip mounting substrate 3 is set as a chip non-mounting surface 3c on which the semiconductor chip 2 or the like is not mounted. Any wiring or terminal (pad) or the like is not formed on the chip non-mounting surface 3c side. Moreover, any internal wiring that extends through the first chip mounting substrate 3 along a thickness direction to communicate with the chip mounting surface 3a or the chip non-mounting surface 3c is not provided. That is, the first chip mounting substrate 3 is a so-called one-sided wiring substrate.

The first chip mounting substrate 3 on which the semiconductor chip 2 is mounted is mounted on a substrate mounting surface 4a which is one main-surface of the second base material (second wiring substrate) 4. That is, the second base material 4 is a second chip mounting substrate on which the semiconductor chip 2 is indirectly mounted via the first chip mounting substrate 3. The second chip mounting substrate 4 is formed to be larger than the first chip mounting substrate 3. The substrate mounting surface 4a of the second chip mounting substrate 4 is disposed to face the chip non-mounting surface 3c of the first chip mounting substrate 3. The first chip mounting substrate 3 is disposed so as to be positioned on the middle part of the second chip mounting substrate 4. In more detail, the first chip mounting substrate 3 is disposed in such a manner that the semiconductor chip 2 mounted on the first chip mounting substrate is positioned on the middle part of the substrate mounting surface 4a of the second chip mounting substrate 4.

Moreover, the first chip mounting substrate 3 is mounted on the second chip mounting substrate 4 while only the edges 3b of the first chip mounting substrate are bonded to the substrate mounting surface 4a by an adhesive material (adhesive resin) 11. In the present embodiment, the first chip mounting substrate 3 is mounted on the second chip mounting substrate 4 while a region of the first chip mounting substrate opposite to the chip mounting region 6 is provided apart from the substrate mounting surface 4a. In more detail, the first chip mounting substrate 3 is mounted on the second chip mounting substrate 4 while the chip non-mounting surface 3c of the first chip mounting substrate is entirely provided apart from the substrate mounting surface 4a.

As described above, the first substrate connection pads 9a for use in connecting the first chip mounting substrate 3 to the second chip mounting substrate 4 are provided on the edges 3b of the first chip mounting substrate 3. That is, as shown in FIG. 1, each first substrate connection pad 9a is provided in a position facing the adhesive material 11 via the first chip mounting substrate 3. As described later, the first chip mounting substrate 3 is electrically connected to the second chip mounting substrate 4 by a wire bonding method. By this structure, an adhesive material formed of a material from which a hardness for appropriately bonding each first substrate connection pad 9a to a bonding wire 12 is obtained is preferably used as the adhesive material 11. Moreover, as the adhesive material 11, it is preferable to use an adhesive material formed of a material from which the hardness is obtained so as to be capable of holding a hollow state between the chip non-mounting surface 3c of the first chip mounting substrate 3 except the edges 3b and the substrate mounting surface 4a of the second chip mounting substrate 4 even after bonding the first chip mounting substrate 3 to the second chip mounting substrate 4.

A plurality of third connection portions 10 for electrically connecting the second chip mounting substrate 4 to the first chip mounting substrate 3 are provided outside a substrate mounting region 13 as a region on which the first chip mounting substrate 3 is mounted on the substrate mounting surface 4a. The respective second connection portions 10 are provided on edges 4b of the second chip mounting substrate 4. In the following description, these third connection portions will be referred to as the second substrate connection pads 10. The respective second substrate connection pads 10 are electrically connected to the first substrate connection pads 9a provided on the first chip mounting substrate 3 via the bonding wires 12. The first and second substrate connection pads 9a, 10 and bonding wires 12 are coated and sealed with sealing members (sealing resins) 14.

It is to be noted that the second substrate connection pads 10 form some of the plurality of wirings (not shown) formed in predetermined patterns on the substrate mounting surface 4a side of the second chip mounting substrate 4. In the present embodiment, the other main surface of the second chip mounting substrate 4 is set as a substrate non-mounting surface (chip non-mounting surface) on which the first chip mounting substrate 3, semiconductor chip 2 or the like is not mounted. Any wiring or terminal (pad) or the like is not formed on the substrate non-mounting surface side. Moreover, any internal wiring that extends through the second chip mounting substrate 4 along the thickness direction to communicate with the substrate mounting surface 4a and the substrate non-mounting surface is not provided. That is, the second chip mounting substrate 4 of the present embodiment is also one-sided wiring substrate similar to the first chip mounting substrate 3.

Figure 6:
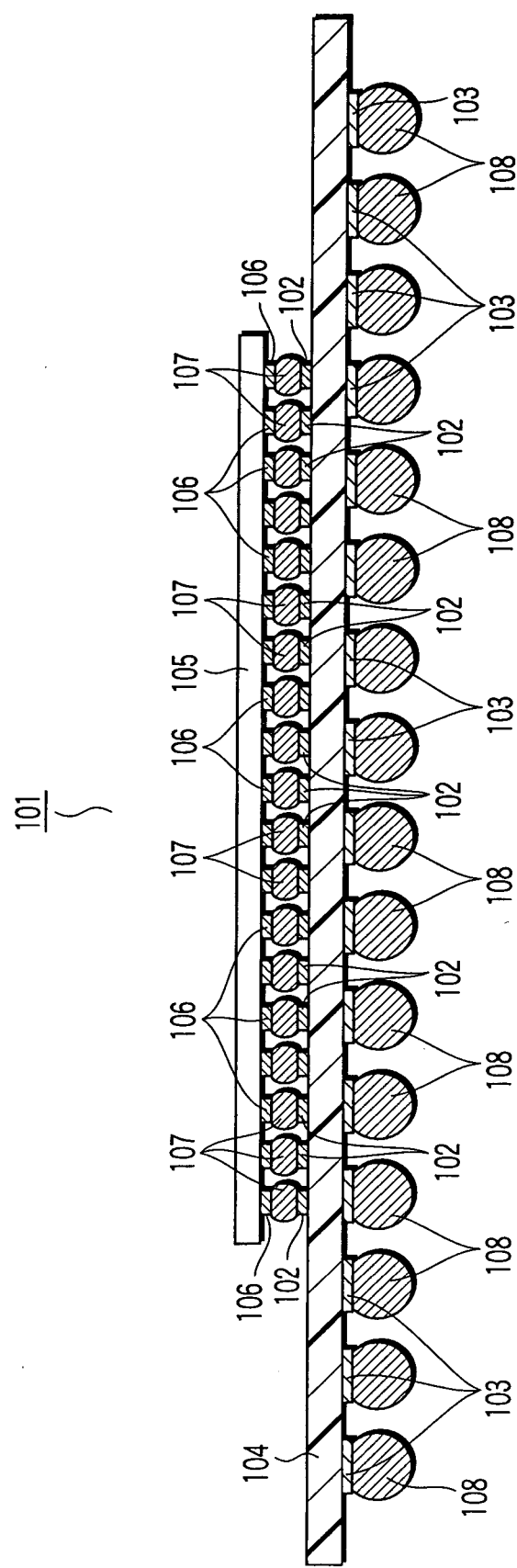
FIG. 6 is a sectional view showing the semiconductor device according to a background art which is a comparative example with respect to the semiconductor device of the first embodiment.

As described in the background art, in a conventional general semiconductor device 101, as shown in FIG. 6, a semiconductor chip 105 is directly mounted on a double-surface wiring substrate 104 on whose front/back (upper/lower) opposite main surfaces a plurality of connection pads 102, 103 are formed. The semiconductor chip 105 is mounted on the wiring substrate 104 while a plurality of electrode pads 106 are bonded to the respective chip connection pads 102 formed on one main surface of the double-surface wiring substrate 104. The respective electrode pads 106 are bonded to the chip connection pads 102 via bumps 107. Solder balls 108 are provided on the surfaces of the external connection pads 103 formed on the other main surface of the wiring substrate 104. The semiconductor chips 102 are electrically connected to external electric components of the mounting substrate (not shown) via the external connection pads 103, solder balls 108 and the like.

However, in the semiconductor device having a structure like the semiconductor device 101, a need for miniaturization and multilayer of the double-surface wiring substrate 104 easily arises. Therefore, manufacturing cost of the wiring substrate 104 easily increases. Additionally, the manufacturing cost of the semiconductor device 101 including the wiring substrate 104 easily increases. In the above-described method of connecting the semiconductor chip 105 to the wiring substrate 104, a large stress is easily applied to the connection portion between the semiconductor chip 105 and the wiring substrate 104, the surface of the semiconductor chip 105 and the like by a difference in a coefficient of thermal expansion between the chip and substrate. Especially, when a brittle low-k film is used in an interlayer insulating film (not shown) in the semiconductor chip 105, there is a high possibility that fatal defects such as peeling of the interlayer insulating film are caused by the stress applied to the semiconductor chip 105. That is, there is a high possibility that durability, reliability, capability, quality and the like of the semiconductor device 101 are deteriorated.

On the contrary, in the semiconductor device 1 of the present embodiment, since the one-sided wiring substrate is used in the chip mounting substrate 3, the cost is low and the manufacturing is facilitated as compared with the use of the double-surface wiring substrate.

Moreover, it is possible to also use test pads for testing whether or not the semiconductor chip 2 is satisfactory in the external connection pads 9b which are the external terminals for mounting provided on the first chip mounting substrate 3. A quality test of the semiconductor chip 2 is conducted, for example, in a state in which the semiconductor chip 2 is mounted on the first chip mounting substrate 3. As a result of the test, when the semiconductor chip 2 is judged to be defective, the integrated semiconductor chip 2 and first chip mounting substrate 3 are regarded as one set of defective products. Moreover, it is decided not to mount the semiconductor chip 2 and first chip mounting substrate 3 regarded as the defective products onto the second chip mounting substrate 4. As a result of the test, when the semiconductor chip 2 is judged to be satisfactory, the integrated semiconductor chip 2 and first chip mounting substrate 3 are regarded as one set of satisfactory products. Moreover, the semiconductor chip 2 and first chip mounting substrate 3 regarded as the satisfactory products are mounted on the second chip mounting substrate 4.

After selecting the satisfactory semiconductor chip 2 from a large number of semiconductor chips 2 beforehand, only the semiconductor chip 2 and the first chip mounting substrate 3 on which the satisfactory semiconductor chip 2 is mounted are mounted on the second chip mounting substrate 4. Accordingly, a quality test of the semiconductor chip 2, and a process of mounting the semiconductor chip 2 and first chip mounting substrate 3 onto the second chip mounting substrate 4 can efficiently be performed. When the satisfactory semiconductor chip 2 is mounted on the first chip mounting substrate 3, a possibility can almost be eliminated that the integrated semiconductor chip 2 and first chip mounting substrate 3 are regarded as the defective products together. As a result, manufacturing efficiency of the whole semiconductor device 1 can be enhanced, and a high yield can be obtained in the whole semiconductor device 1. Additionally, the manufacturing cost of the semiconductor device 1 is reduced, and an inexpensive semiconductor device 1 can be provided.

Moreover, the respective external connection pads 9b are fanned out and disposed on the outer peripheral portion of the semiconductor chip 2, and do not face the second chip mounting substrate 4. Therefore, electric contact is also facilitated in performing a chip selection test.

Furthermore, since the semiconductor chip 2 is flip-chip-connected to the first chip mounting substrate 3, a planar (two-dimensional) space for drawing around wires as required in the wire bonding method is unnecessary. This can miniaturize the first chip mounting substrate 3. Additionally, the second chip mounting substrate 4 can be miniaturized. A height (solid space, three-dimensional space) for drawing around the wire is also unnecessary. Therefore, when the semiconductor chip 2 is thinned and miniaturized, it is also easy to store the semiconductor chip 2 in a space (gap) from a mounting substrate (not shown) connected to the first chip mounting substrate 3 via the external connection pads 9b. As a result, the whole semiconductor device 1 can be formed to be compact, and the space can be saved. Furthermore, a wiring distance between the semiconductor chip 2 and each external connection pad 9b shortens, and a loop inductance between the semiconductor chip 2 and each external connection pad 9b decreases. Accordingly, a high-rate operation of the semiconductor device 1 is possible.

Moreover, because the first substrate connection pads 9a provided on the first chip mounting substrate 3 are coupled with each second substrate connection pads 10 provided on the second chip mounting substrate 4 by the wire bonding method, pitches of the first substrate connection pads 9a can largely be reduced as compared with pitches of via plugs which have heretofore been provided on the chip mounting substrate. As a result, a size of the first chip mounting substrate 3 can be reduced. The first substrate connection pads 9a are provided on the chip mounting surface 3a of the first chip mounting substrate 3 in the same manner as in the chip connection pads 7 and external connection pads 9b. That is, the first chip mounting substrate 3 is the one-sided wiring substrate. Therefore, it is not necessary to provide the via plugs (through plugs) extending through the first chip mounting substrate 3 along the thickness direction. Furthermore, since the second substrate connection pads 10 are disposed on the edges 4b of the second chip mounting substrate 4, a design rule of the second chip mounting substrate 4 can be relaxed. Accordingly, the semiconductor device 1 can be reduced in size and cost.

Furthermore, the first chip mounting substrate 3 is bonded and mounted onto the second chip mounting substrate 4 by the adhesive material (resin) 11 having high rigidity on the opposite side (backside) of the first substrate connection pads 9a provided on the edges 3b. Accordingly, a connection yield can be enhanced in wire-bonding the first substrate connection pads 9a to the second substrate connection pads 10.

Additionally, the hollow state is obtained between the portion of the first chip mounting substrate 3 except the edges 3b and the second chip mounting substrate 4, and the semiconductor chip 2 is not rigidly fixed to the second chip mounting substrate 4. This can relax various stresses such as a thermal stress applied to the semiconductor chip 2, and can prevent various stresses from being easily concentrated on the semiconductor chip 2. The function and effect can further be enhanced, when the first chip mounting substrate 3 is thinned and the first chip mounting substrate 3 is formed of a material high in softness (flexibility) or a material that is not easily thermally expandable. Furthermore, if the so-called low-k film is used in the interlayer insulating film in the semiconductor chip 2 (not shown), the above-described function and effect are remarkably high.

Moreover, since the thin semiconductor chip 2 having a thickness of about 0.15 mm or less is used, the softness (flexibility) of the semiconductor chip 2 itself is high. Therefore, the semiconductor chip 2 is easily deformed, twisted, and warped. Accordingly, for example, a stress generated between the semiconductor chip 2 and the first chip mounting substrate 3 can be relaxed by the warp or the like of the semiconductor chip 2 itself. That is, the semiconductor chip 2 easily follows the stress applied thereto, and is resistant to the stress. Therefore, when the first chip mounting substrate 3 and second chip mounting substrate 4 are formed of film or tape-shaped low-stress materials, the whole semiconductor device 1 can be prepared as a film or tape-shaped low-stress semiconductor device. As a result, application, applied place, applied environment or the like of the semiconductor device 1 can largely be enlarged.

Furthermore, the first substrate connection pads 9a are disposed on the edges 3b of the first chip mounting substrate 3. Accordingly, the bonding wires 12 for connecting the first substrate connection pads 9a to the second substrate connection pads 10 can be collected on the edges 3b of the first chip mounting substrate 3. As a result, it is easy to seal the first substrate connection pads 9a, second substrate connection pads 10, and bonding wires 12. Since the first substrate connection pads 9a are disposed on the edges 3b of the first chip mounting substrate 3, a design rule of the first chip mounting substrate 3 can be relaxed. Accordingly, a degree of freedom in arrangement of the first substrate connection pads 9a can be enhanced, and the number of first substrate connection pads 9a can also be increased.

Moreover, the second substrate connection pads 10 are disposed on an outer peripheral portion of the substrate mounting region 13 of the second chip mounting substrate 4. Accordingly, the first substrate connection pads 9a can be electrically connected to the second substrate connection pads 10 via the bonding wires 12 without providing any through hole in the first chip mounting substrate 3. As a result, a hole processing cost into the first chip mounting substrate 3 can be saved. Moreover, it is possible to eliminate a restriction on a degree of freedom in the wiring of the first chip mounting substrate 3 by hole formation. Since the second substrate connection pads 10 are disposed on the edges 4b of the second chip mounting substrate 4, the design rule of the second chip mounting substrate 4 can be relaxed. Accordingly, the degree of freedom in the arrangement of the second substrate connection pads 10 can be enhanced, and further the number of second substrate connection pads 10 can also be increased.

Furthermore, the semiconductor chip 2 is provided so as to be positioned in the middle part of the semiconductor device 1, that is, a symmetry center. Accordingly, even when the stress acts on the semiconductor device 1 from the outside, the stress can be uniformly scattered, escaped, or absorbed in the whole semiconductor device 1. As a result, it is almost possible to eliminate a possibility that the stress deviates and is concentrated on the semiconductor chip 2. As a result, the durability, reliability, capability, quality and the like of the semiconductor chip 2 and further the whole semiconductor device 1 can be enhanced.

As described above, in accordance with the first embodiment, the semiconductor chip 2, chip connection pads 7, first substrate connection pads 9a, and external connection pads 9b are provided on the chip mounting surface 3a side of the first chip mounting substrate 3. Accordingly, since the one-sided wiring substrate is usable in the first chip mounting substrate 3, the manufacturing cost can be reduced as compared with the use of the double-surface wiring substrate. Since the portion between the first chip mounting substrate 3 on the opposite side of the chip mounting region 6 and the second chip mounting substrate 4 is hollow, the first chip mounting substrate 3 and semiconductor chip 2 are easily bent, and the stress is easily relaxed. Accordingly, it is possible to reduce the film peeling in the semiconductor chip 2 by the stress after mounting the semiconductor chip 2 and first chip mounting substrate 3 on the second chip mounting substrate 4.

That is, in accordance with the semiconductor device 1 of the present embodiment, the wiring structures of the first and second base materials 3, 4 on which the semiconductor chip 2 is directly or indirectly mounted, and the bonding method between the base materials 3, 4 are improved, therefore the durability, reliability, capability, quality, and the like are enhanced, and further the device can be easily manufactured at a low cost.

Second Embodiment

Next, a second embodiment of the present invention will be described with reference to FIG. 2. FIG. 2 is a sectional view showing the semiconductor device according to the present embodiment. It is to be noted that the same part as that of the first embodiment is denoted with the same reference numerals, and detailed description thereof is omitted.

The present embodiment is different from the first embodiment in that the semiconductor chip is connected to and mounted onto the first chip mounting substrate by the wire bonding method.

As shown in FIG. 2, in a semiconductor device 21 of the present embodiment, the semiconductor chip 2 is mounted on the first chip mounting substrate 3 while the device forming surface 2a is directed on the side opposite to the chip mounting surface 3a of the first chip mounting substrate 3. The semiconductor chip 2 is bonded to the chip mounting region 6 of the chip mounting surface 3a by an adhesive material 22 for mounting chips. The chip connection pads 7 are disposed between the chip mounting region 6 and the region on which the external connection pads 9b are provided. The electrode pads 5 of the semiconductor chip 2 are electrically connected to the chip connection pads 7 by a plurality of bonding wires 23 for chip connection. In this manner, in the present embodiment, the semiconductor chip 2 is connected to the first chip mounting substrate 3 by the wire bonding method. The semiconductor chip 2 is mounted on the first chip mounting substrate 3 while the device forming surface 2a is directed not to face the chip mounting surface 3a of the first chip mounting substrate 3 in a so-called face-up state.

As described above in accordance with the second embodiment, an effect similar to that of the first embodiment can be obtained. Since the semiconductor chip 2 is mounted on the first chip mounting substrate 3 by the wire bonding method, the pitch between the chip connection pads 7 can be enlarged as compared with the first embodiment. This can relax the design rule of the first chip mounting substrate 3. Additionally, the manufacturing cost of the semiconductor device 21 can further be reduced.

Third Embodiment

Next, a third embodiment of the present invention will be described with reference to FIG. 3. FIG. 3 is a plan view showing the semiconductor device of the present embodiment as seen from the semiconductor chip side. It is to be noted that the same part as that of the first embodiment is denoted with the same reference numerals, and the detailed description thereof is omitted.

The present embodiment is different from the first embodiment in that a conductive layer is further provided on each external connection pad.

As shown in FIG. 3, a conductive layer 32 comprising at least one layer is provided on the surface of the external connection pad 9b in a semiconductor device 31 of the present embodiment. At least a surface layer portion of each conductive layer 32 is formed of a metal which is high in conductivity and is not easily deteriorated, such as solder and gold (Au).

As described above, in accordance with the third embodiment, the effect similar to that of each of the first and second embodiments can be obtained. The conductive layer (conductive film, metal film) 32 at least whose surface layer portion is formed of the solder, gold (Au) or the like is provided on the surface of each external connection pad 9b. Accordingly, the semiconductor device 31 can be mounted as a land grid array package (LGAP) on the mounting substrate or the like (not shown).

Fourth Embodiment

Figure 4:
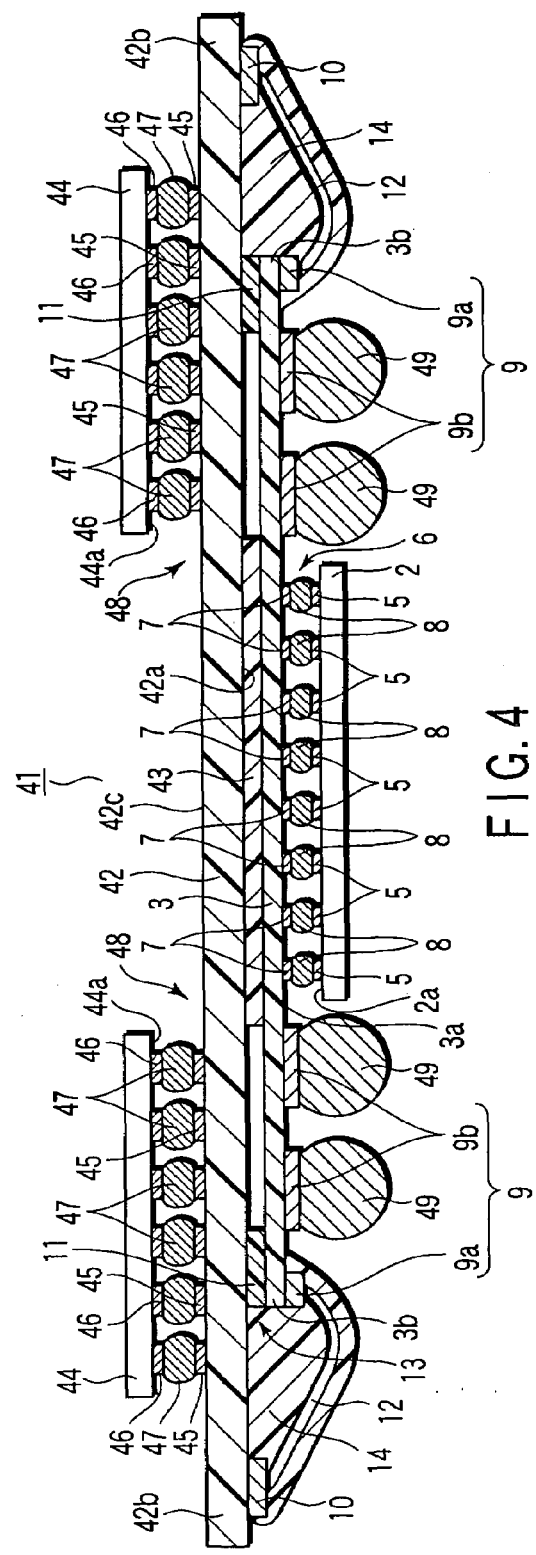
FIG. 4 is a sectional view showing the semiconductor device according to a fourth embodiment.

Next, a fourth embodiment of the present invention will be described with reference to FIG. 4. FIG. 4 is a sectional view showing the semiconductor device according to the present embodiment. It is to be noted that the same part as that of the first embodiment is denoted with the same reference numerals, and the detailed description thereof is omitted.

The present embodiment is different from the first embodiment in the number and mounting position of the semiconductor device to be mounted on the second chip mounting substrate, the connection state between the first and second chip mounting substrates, and the constitution of each external connection pad.

As shown in FIG. 4, in a semiconductor device 41 of the present embodiment, a resin adhesive material 43 is provided between the first chip mounting substrate 3 and a second chip mounting substrate 42. In more detail, the adhesive material 43 is provided between the region corresponding to the side (backside) of the chip non-mounting surface 3c of the first chip mounting substrate 3 opposite to chip mounting region 6 and a substrate mounting surface 42a of the second chip mounting substrate 42. The adhesive material 43 is formed of a resin having an elasticity of about 3.2 MPa or less, such as elastomer. That is, in the present embodiment, for the first chip mounting substrate 3, the edges 3b are bonded to the second chip mounting substrate 42 via the hard adhesive material 11, and the middle part is bonded via the soft adhesive material 43. The region facing the first chip mounting substrate 3 except the middle part and edges 3b is set to a hollow state between the first chip mounting substrate 3 and the second chip mounting substrate 42 in the same manner as in the first embodiment.

Separately from the semiconductor chip 2 directly mounted on the first chip mounting substrate 3, at least one semiconductor chip (electric component) 44 is directly mounted on the main surface of the second chip mounting substrate 42 on the opposite side of the substrate mounting surface 42a. To distinguish the semiconductor chip 44 from the semiconductor chip 2 directly mounted on the first chip mounting substrate 3, the semiconductor chip 2 directly mounted on the first chip mounting substrate 3 will be referred to as the first semiconductor chip 2, and the semiconductor chip 44 directly mounted on the second chip mounting substrate 42 will be referred to the second semiconductor chip 44. In the following description, the chip mounting surface 3a of the first chip mounting substrate 3 will be referred to as the first chip mounting surface 3a, and the main surface of the second chip mounting substrate 42 on which the second semiconductor chip 44 is mounted will be referred to as a second chip mounting surface 42c. In the present embodiment, two second semiconductor chips 44 are mounted on the second chip mounting surface 42c of the second chip mounting substrate 42.

Moreover, a plurality of chip connection pads 45 electrically connected to the second semiconductor chips 44 are provided as fourth connection portions on the second chip mounting surface 42c of the second chip mounting substrate 42. To distinguish the chip connection pads 45 from the chip connection pads 7 provided on the first chip mounting substrate 3, the chip connection pads 7 of the first chip mounting substrate 3 will be referred to as the first chip connection pads 7, and the chip connection pads 45 of the second chip mounting substrate 42 will be referred to as the second chip connection pads 45. The second chip connection pads 45 are provided on the second chip mounting surface 42c in accordance with the position on which each second semiconductor chip 44 is mounted, and the positions and number of a plurality of electrode pads 46 provided on a device forming surface 44a of each second semiconductor chip 44. In more detail, the second chip connection pads 45 are provided outside a region of the second chip mounting surface 42c on the opposite side (backside) of a region of the substrate mounting surface 42a on which the adhesive material 43 is provided. In other words, the second chip connection pads 45 are provided outside a region of the second chip mounting surface 42c facing the chip mounting region 6 of the first chip mounting substrate 3.

Therefore, the second semiconductor chips 44 are mounted on the second chip mounting substrate 42 in positions which do not overlap the semiconductor chip 2 and adhesive material 43 in a lamination direction of the first chip mounting substrate 3 and second chip mounting substrate 42. The electrode pads 46 of each second semiconductor chip 44 are bonded to the second chip connection pads 45 of the second chip mounting substrate 42 via bonding members (solder bumps) 47 having conductivity. That is, each second semiconductor chip 44 is flip-chip-connected to the second chip connection pads 45 and mounted on the second chip mounting surface 42c of the second chip mounting substrate 42 in the position which does not over lap with the semiconductor chip 2 and adhesive material 43 in the thickness direction of the semiconductor device 41. To distinguish the region of the second chip mounting surface 42c on which each second semiconductor chip 44 is mounted and the chip mounting region 6 of the first chip mounting substrate 3, the chip mounting region 6 of the first chip mounting substrate 3 will be referred to as the first chip mounting region 6, and the region of the second chip mounting substrate 42 on which the second semiconductor chip 44 is mounted will be referred to as a second chip mounting region 48.

It is to be noted that the second chip connection pads 45 form some of a plurality of wirings (not shown) formed in predetermined patterns on the second chip mounting surface 42c side of the second chip mounting substrate 42. Although not shown, the internal wirings (through wirings) which extend through the second chip mounting substrate along the thickness direction to communicate with the substrate mounting surface 42a and the second chip mounting surface 42c, such as through plugs and via plugs, are provided in the second chip mounting substrate 42. Accordingly, for example, some of the second chip connection pads 45 provided on the second chip mounting surface 42c of the second chip mounting substrate 42 are electrically connected to some of the second substrate connection pads 10 provided on edges 42b of the substrate mounting surface 42a via predetermined path. That is, the second semiconductor chips 44 are electrically connected to the outside of the semiconductor device 41 via the external connection pads 9b provided on the chip mounting surface 3a of the first chip mounting substrate 3. In this manner, the second chip mounting substrate 42 of the present embodiment is the double-surface wiring substrate different from the first chip mounting substrate 3 and the second chip mounting substrate 4 of the first embodiment.

Furthermore, each one solder ball 49 is provided on each external connection pad 9b.

As described above, in accordance with the fourth embodiment, the effect similar to that of the first to third embodiments can be obtained. The second chip connection pads 45 are provided on the second chip mounting surface 42c of the second chip mounting substrate 4, and the second chip mounting substrate 42 is the double-surface wiring substrate. Accordingly, it is possible to effectively use the space on the second chip mounting surface 42c side of the second chip mounting substrate 42. For example, as described above, the second semiconductor chips 44 can be mounted on the second chip mounting surface 42c to enhance a mounting density of the semiconductor device 41 of the present embodiment. It is to be noted that, needless to say, in addition to the second semiconductor chip 44, various electric components such as a passive component, MEMS component, and optical component may also be laid on each second chip connection pad 45. Even in this case, needless to say, high-density mounting is possible.

Moreover, the adhesive material 43 which has an elasticity of about 3.2 MPa or less and which is softer than the adhesive material 11 is provided between the region of the first chip mounting substrate 3 on the opposite side of the chip mounting region 6 and the second chip mounting substrate 42. Accordingly, an adhesion of the first chip mounting substrate 3 to the second chip mounting substrate 42 is enhanced, whereas the softness (ease of deformation) of the first chip mounting substrate 3 and first semiconductor chip 2 can be held in the same manner as in the first embodiment. That is, the durability, reliability, capability, quality, and the like of the semiconductor device 41 are enhanced.

Furthermore, each one solder ball 49 is provided on the surface of each external connection pad 9b. Accordingly, the semiconductor device 41 is mounted as the ball grid array package (BGAP) on the mounting substrate or the like (not shown).

Furthermore, the second semiconductor chips 44 are mounted on the second chip mounting regions 48 which do not overlap with the first semiconductor chip 2 and adhesive material 43 in the thickness direction of the semiconductor device 41. Accordingly, the mounting density of the semiconductor device 41 can be enhanced without sacrificing the stress relaxing capabilities of the first semiconductor chip 2 and first chip mounting substrate 3.

When each of the second chip connection pads 45 is provided on the second chip mounting surface 42c of the second chip mounting substrate 42, the external device other than the first semiconductor chip 2 can be mounted on the second chip mounting substrate 42. That is, when the second chip mounting substrate 42 is constituted as the double-surface wiring substrate, the mounting density of the semiconductor device 41 can be enhanced. Accordingly, for example, a chip mixed/loaded type semiconductor device can be easily manufactured. Since the soft adhesive material 43 is provided between the region of the first chip mounting substrate 3 on the opposite side of the chip mounting region 6 and the second chip mounting substrate 42, the stress relaxing capability can be held in the same manner as in the first embodiment. It is also possible to reduce the film peeling or the like in the first semiconductor chip 2 by the stress after mounting the first semiconductor chip 2 and first chip mounting substrate 3 on the second chip mounting substrate 42.

Fifth Embodiment

Figure 5:
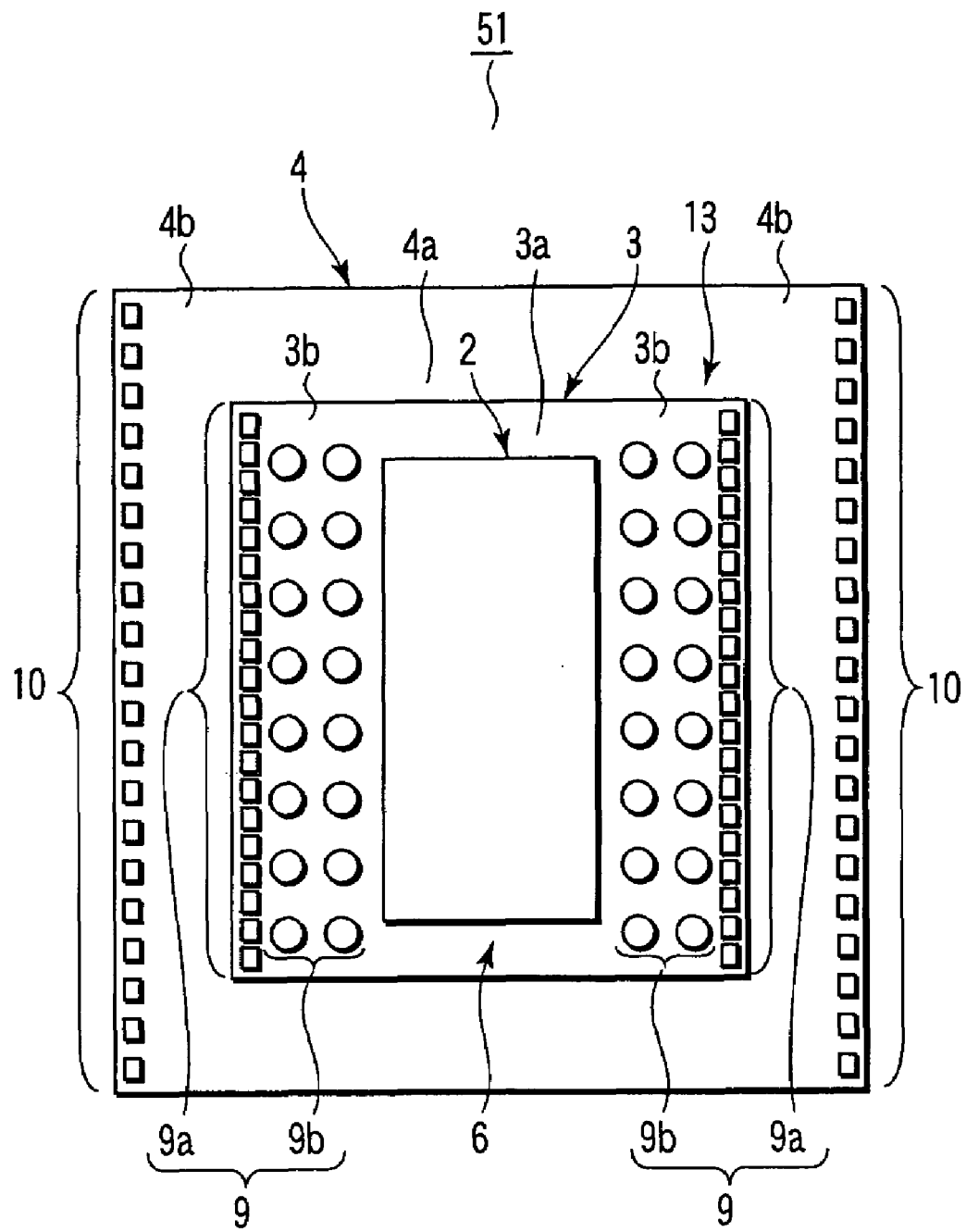
FIG. 5 is a plan view showing the semiconductor device according to a fifth embodiment seen from a semiconductor chip side.

Next, a fifth embodiment of the present invention will be described with reference to FIG. 5. FIG. 5 is a plan view showing the semiconductor device according to the present embodiment seen from the semiconductor chip side. It is to be noted that the same part as that of the first embodiment is denoted with the same reference numerals, and the detailed description thereof is omitted.

The present embodiment is different from the first embodiment in that the first and second substrate connection pads are disposed in outermost peripheral parts of the first and second chip mounting substrates.

As shown in FIG. 5, in a semiconductor device 51 of the present embodiment, the first substrate connection pads 9a are disposed on the outermost peripheral parts of the chip mounting surface 3a of the first chip mounting substrate 3. Moreover, the second substrate connection pads 10 are disposed on the outermost peripheral parts of the substrate mounting surface 4a of the second chip mounting substrate 4.

As described above, in accordance with the fifth embodiment, the effect similar to that of the first to third embodiments can be obtained. Since the first substrate connection pads 9a are disposed on the outermost peripheral parts of the chip mounting surface 3a of the first chip mounting substrate 3, and the second substrate connection pads 10 are disposed on the outermost peripheral parts of the substrate mounting surface 4a of the second chip mounting substrate 4, the pad pitches between the first substrate connection pads 9a and the second substrate connection pads 10 can be largely increased. This largely relaxes the design rule of the first and second chip mounting substrates 3, 4, and the degree of freedom of the wiring design can be largely enhanced. Accordingly, the degree of freedom in arranging the first and second substrate connection pads 9a, 10 can be largely enhanced, and further the numbers of the substrate connection pads 9a, 10 can also be largely increased. That is, in the semiconductor device 51 of the present embodiment, as compared with the semiconductor devices 1, 21, 31, 41, 51 of the first to fourth embodiments, the degrees of freedom in the wiring design, the arrangement of the first and second substrate connection pads 9a, 10, and set ranges of the numbers of the substrate connection pads 9a, 10 are largely enhanced.

It is to be noted that the semiconductor device and manufacturing method of the present invention are not limited to the first to fifth embodiments. A part of the constitution or the manufacturing process of the present invention can be changed to various settings, or various settings may be appropriately combined and carried out without departing from the scope of the present invention.

For example, in the semiconductor device 41 of the fourth embodiment, the second semiconductor chips 44 may also be mounted on the second chip mounting substrate 42 by the wire bonding method. Alternatively, with respect to a plurality of semiconductor devices 41, the second chip connection pads 45 are provided for the respective solder balls 49 (external connection pads 9b). Moreover, the second chip connection pads 45 of the certain semiconductor device 41 are bonded to the solder balls 49 of the other semiconductor device 41. In this manner, the other semiconductor devices 41 are mounted on the second chip mounting surface 42c of the second chip mounting substrate 4 of the semiconductor device 41. Accordingly, a chip lamination type semiconductor device (multi chip package, multi chip module) comprising a plurality of semiconductor devices 41 may also be manufactured.

Moreover, in the semiconductor device 41 of the fourth embodiment, the adhesive material 43 formed of the resin having an elasticity of about 3.2 MPa or less does not necessarily have to be provided between the first chip mounting substrate 3 and the second chip mounting substrate 42. In the same manner as in the semiconductor devices 1, 21, 31 of the first to third embodiments, the portion between the first chip mounting substrate 3 and the second chip mounting substrate 42 except the portions facing the edges 3b of the first chip mounting substrate 3 may be set to the hollow state. In the semiconductor devices 1, 21, 31 of the first to third embodiments, the adhesive material 43 formed of the resin with about 3.2 MPa or less may also be provided between the first chip mounting substrate 3 and the second chip mounting substrate 42.

Moreover, the conductive layers 32 are provided so as to cover only the end surfaces of the external connection pads 9b in the semiconductor device 31 of the third embodiment, but the present invention is not limited to this. The conductive layer 32 may also be provided so as to cover the whole surface of each external connection pad 9b. In this case, the durability of each external connection pad 9b can be enhanced, and further the ease of connection can be enhanced.

Furthermore, the semiconductor chip 2 is formed to be thin in the first to fifth embodiments, but additionally the first chip mounting substrate 3 and second chip mounting substrates 4, 42 may also be formed as a flexible base material having a thin shape and softness (flexibility). For example, the first chip mounting substrate 3 and second chip mounting substrates 4, 42 may also be formed in a tape or film shape using glass epoxy, polyimide, BT resin, PCB or the like. Accordingly, the stress relaxing capabilities of not only the first semiconductor chip 2 and second semiconductor chip 44 but also the whole semiconductor devices 1, 21, 31, 41, 51 can be remarkably enhanced. As a result, the durability, reliability, capability, quality, and the like of the respective semiconductor devices 1, 21, 31, 41, 51 can be remarkably enhanced. Moreover, the lightening, compacting, and space saving of the semiconductor devices 1, 21, 31, 41, 51 can be remarkably enhanced. As a result, versatility of the semiconductor device 1 can be remarkably-enhanced.

Furthermore, when the semiconductor devices 1, 21, 31, 41, 51 are sealed by the sealing resin, the sealing resin may be provided so as to have symmetry with respect to the center of each of the semiconductor devices 1, 21, 31, 41, 51. That is, the sealing resin may be provided in such a manner that at least the first semiconductor chip 2 has the symmetry center. Accordingly, even when the stress acts on each of the semiconductor devices 1, 21, 31, 41, 51 after packaged by the sealing resin, the stress can be uniformly scattered, escaped, or absorbed in the whole package. As a result, it is almost possible to remove the possibility that the stress deviates and is concentrated on the specific place of each of the semiconductor devices 1, 21, 31, 41, 51, such as the first semiconductor chip 2. As a result, the durability, reliability, capability, quality, and the like of the semiconductor devices 1, 21, 31, 41, 51 can be remarkably enhanced. This also applies to the adhesive materials 11, 43.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
a first base material which is provided at least one semiconductor device mounted on one main surface of the first base material, a plurality of first connection portions provided on the main surface of the first base material on the side on which the semiconductor device is mounted and being electrically connected to the semiconductor device, and a plurality of second connection portions provided outside a region on which the semiconductor device is mounted on the main surface of the first base material on the side on which the semiconductor device is mounted; and
a second base material which is disposed facing the main surface of the first base material on a side opposite to the side on which the semiconductor device is mounted, bonded to an edge of the first base material so that the first base material is mounted on the second base material, and provided a plurality of third connection portions provided outside a region on which the first base material is mounted on the main surface of the second base material on the side facing the first base material and being electrically connected to at least one of the second connection portions.

2. The device according to claim 1, wherein:
the region of the first base material on the opposite side of the region on which the semiconductor device is mounted is provided apart from the second base material.

3. The device according to claim 1, wherein:
the region of the first base material on the opposite side of the region on which the semiconductor device is mounted, is bonded to the second base material by an adhesive material having an elasticity of 3.2 MPa or less.

4. The device according to claim 1, wherein:
the semiconductor device has a thickness of 0.15 mm or less.

5. The device according to claim 1, wherein:
the second connection portion connected to the third connection portion among the respective second connection portions is provided outside the other second connection portions.

6. The device according to claim 1, further comprising:
a conductive layer comprising at least one layer or a solder ball, provided on the second connection portion other than the second connection portion connected to the third connection portion among the respective second connection portions.

7. The device according to claim 1, wherein:
the semiconductor device is flip-chip or wire-bonding connected to the first connection portions and mounted on the first base material.

8. The device according to claim 1, wherein:
the first base material is a one-sided wiring substrate which is provided the respective first connection portions and the respective second connection portions only on the side of the first base material on which the semiconductor device is mounted.

9. The device according to claim 1, wherein:
the first base material is bonded to the second base material by an adhesive material, which comprising a material from which hardness is obtained so as to be capable of electrically and appropriately connecting the respective second connection portions to the third connection portions by a wire bonding method and holding the first base material apart from the second base material, and provided on an edge of the main surface of the first base material on a side opposite to the side on which the semiconductor device is mounted.

10. The device according to claim 1, further comprising:
at least one electric component other than the semiconductor device, mounted on the main surface of the second base material on a side opposite to the side on which the first base material is mounted.

* * * * *